United States Patent

Shou et al.

Patent Number: 5,521,543
Date of Patent: May 28, 1996

[54] AVERAGING CIRCUIT

[75] Inventors: Guoliang Shou; Sunao Takatori; Makoto Yamamoto, all of Tokyo, Japan

[73] Assignees: Yozan, Inc., Tokyo; Sharp Corporation, Osaka, both of Japan

[21] Appl. No.: 422,068

[22] Filed: Apr. 13, 1995

Related U.S. Application Data

[63] Continuation of Ser. No. 111,423, Aug. 25, 1993, abandoned.

[30] Foreign Application Priority Data

Aug. 25, 1992 [JP] Japan ................................ 4-248690

[51] Int. Cl.⁶ ........................................... G06G 7/12
[52] U.S. Cl. ..................... 327/355; 327/361; 327/408
[58] Field of Search ........................... 328/104; 307/242, 307/498; 327/403, 404, 407, 408, 409, 410, 355, 361; 326/104

[56] References Cited

U.S. PATENT DOCUMENTS

| | | |
|---|---|---|
| 3,492,588 | 1/1970 | Woodward, Jr. |
| 3,601,634 | 8/1971 | Ebertin .................................. 307/242 |
| 3,681,699 | 8/1972 | Kelly et al. ........................... 328/104 |
| 4,718,063 | 1/1988 | Reedy et al. .......................... 328/104 |
| 4,890,016 | 12/1989 | Tanaka et al. ....................... 307/242 |
| 5,162,672 | 11/1992 | McMahan et al. .................. 307/242 |
| 5,298,814 | 3/1994 | Caruso ................................. 327/105 |

FOREIGN PATENT DOCUMENTS

WO8501622   4/1985   WIPO .

OTHER PUBLICATIONS

Battison, "Analog Signal Multiplexing without FETS", INSPEC, Electronic Engineering, Dec. 1974, p. 17.
Patent Abstracts of Japan, vol. 5, No. 34, Mar. 1981, JP-A-55 159 604.

*Primary Examiner*—Toan Tran
*Attorney, Agent, or Firm*—Cushman Darby & Cushman

[57] ABSTRACT

A small high speed averaging circuit includes a plurality of CMOS transistor pairs with substantially equal characteristics. Their voltage follower outputs are connected to a common output. A mean value is generated at the common output of the CMOS transistor pairs.

2 Claims, 1 Drawing Sheet

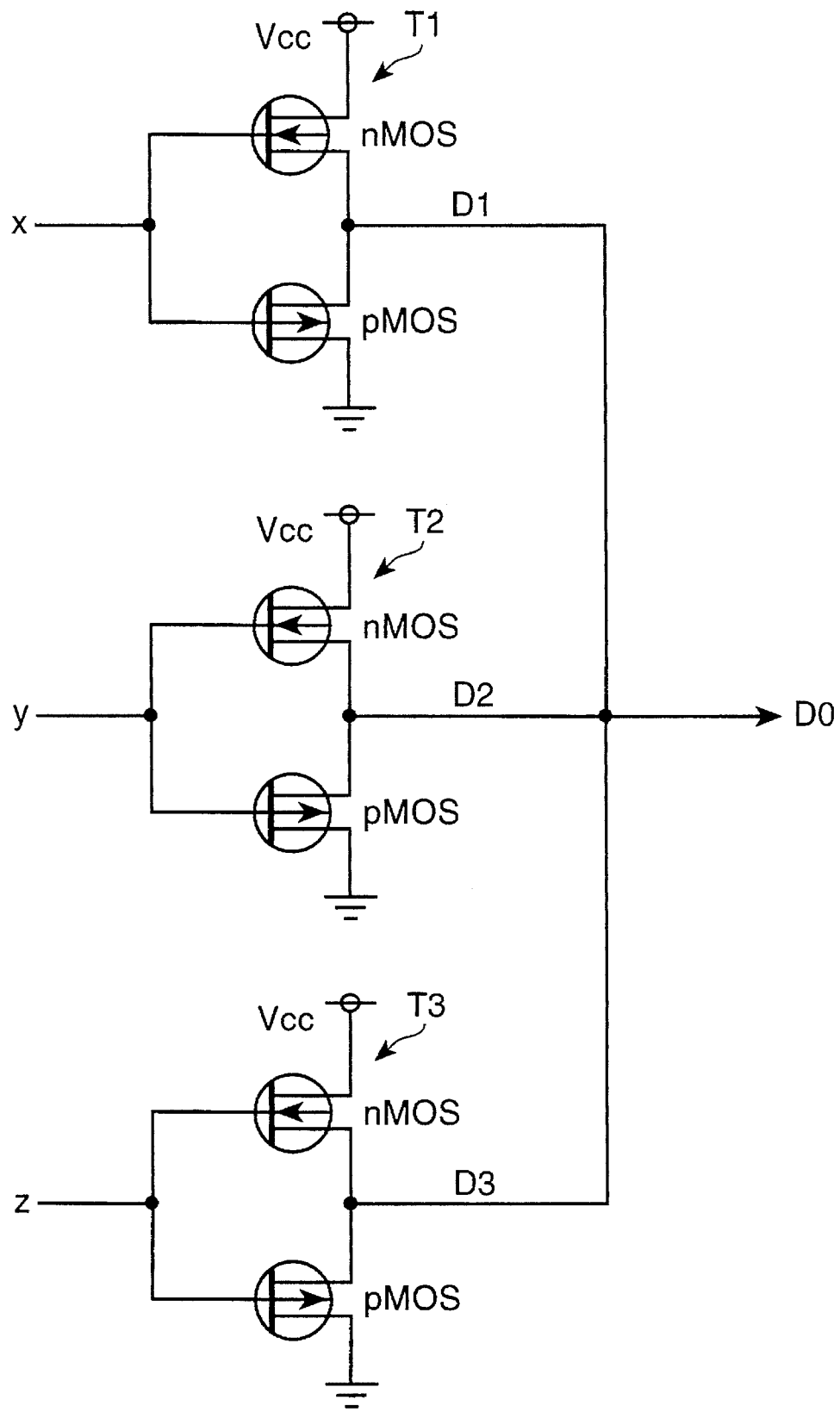

AVERAGING CIRCUIT

This is a continuation of application Ser. No. 08/111,423, filed on Aug. 25, 1993 now abandoned.

FIELD OF THE INVENTION

This invention relates to an averaging circuit for outputting a mean value of a plural number of inputs.

BACKGROUND OF THE INVENTION

Conventionally, a complicated calculation, such as a calculation of a mean value of a plural number of data, is performed by a digital computer. However, a lot of circuits including summation circuits, registers and substraction circuits are required. Because substraction circuits cannot operate high speed, the process speed is limited.

SUMMARY OF THE INVENTION

This invention solves the above problems and provides a small sized and high speed averaging circuit.

An averaging circuit according to the present invention includes CMOS transistor pairs, the voltage follower outputs thereof are connected to a common output, so that a mean value of inputs of the CMOS transistor pairs is generated.

BRIEF DESCRIPTION OF THE DRAWINGS

FIG. 1 is a circuit diagram showing an embodiment of an averaging circuit according to the present invention.

PREFERRED EMBODIMENT OF THE PRESENT INVENTION

Hereinafter an embodiment of an averaging circuit according to this invention is described with reference to the attached drawings.

In FIG. 1, a averaging circuit includes a plural number of CMOS transistor pairs (shown by reference T1, T2 and T3) connected in parallel. Input voltages x, y and z are provided to T1, T2 and T3. T1, T2 and T3 have voltage follower outputs D1, D2 and D3 that are connected to a common output D0. Each CMOS has characteristics substantially equal to one another and the independent characteristics of each CMOS transistor pair are defined as followings:

$$D1 = x - (V_{tp} + V_{tn})/2$$

$$D2 = y - (V_{tp} + V_{tn})/2$$

$$D3 = z - (V_{tp} + V_{tn})/2$$

$V_{tp}$ is a threshold voltage of the pMOS transistor.

$V_{tn}$ is a threshold voltage of the nMOS transistor.

If the pMOS transistor and the nMOS transistor in the CMOS transistor pair are enhancement type, transistor ($V_{tp} + V_{tn}$) has a positive value and an effect voltage exists unpreferably for a mean value calculation. So, depletion type pMOS and nMOS transistors are used in the CMOS transistor pair.

By connecting the outputs of these CMOS transistor pairs, a stable point of each CMOS transistor pair becomes an output voltage for the common output, and as the result, $$D0 = (x+y+z)/3 - (V_{tp} + V_{tn})/2.$$

That is, the common output D0 is a subtraction result of a mean value of a threshold voltage from a mean value of input voltages x, y and z. The common output represents a mean value, however, when $V_{tp}$ and $V_{tn}$ are adjusted to 0 [V] by designing each CMOS transistor pair for the specification, a characteristics of $D0 = (x+y+z)/3$ can be obtained.

As mentioned above, the embodiment includes 3 CMOS transistor pairs connected in parallel, however, a mean value corresponding to 2 or more than 3 inputs can be output by connecting 2 or more than 3 CMOS transistor pairs similarly. In the case that the offset voltage is useful, the enhancement type pMOS and nMOS transistors are applied.

The time for obtaining these outputs is almost the same as response time of 1 CMOS transistor, and the calculation speed is much higher than that of a digital circuit. As shown by the circuit in the embodiment, the size of circuit is very small.

An averaging circuit according to this invention has advantages of a small size and high responding speed, because a mean value of inputs of the CMOS transistor pairs is generated on the common output, by connecting a voltage follower output of the CMOS transistor pairs; and to the common output of the CMOS transistor pairs.

What is claimed is:

1. An average circuit comprising:
   i) a plurality of CMOS transistor pairs, wherein each CMOS transistor pair includes an nMOS transistor having a drain, a gate, and a source, and a pMOS transistor having a drain, a gate, and a source, said nMOS and said pMOS transistors in each CMOS transistor pair having substantially equal characteristics, said drain of said nMOS transistor being connected to a reference voltage, said drain of said pMOS transistor being connected to ground, and said source of said nMOS transistor and said source of said pMOS transistor in said CMOS transistor pairs being connected at all times during operation of said averaging circuit to a common output so that an electrical contact exists at all times during operation of said averaging circuit between said output of each of said CMOS transistor pairs and said common output; and
   ii) a plurality of input voltages, one of said input voltages being connected to said gate of said nMOS transistor and said gate of said pMOS transistor in each of said CMOS transistor pairs, respectively.

2. An averaging circuit as in claim 1, wherein said CMOS transistor pairs are of depletion type.

* * * * *